United States Patent
Liao

(10) Patent No.: US 9,793,390 B2
(45) Date of Patent: Oct. 17, 2017

(54) LOW MILLER FACTOR SEMICONDUCTOR DEVICE

(71) Applicant: DELTA ELECTRONICS, INC., Taoyuan (TW)

(72) Inventor: Wen-Chia Liao, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/955,481

(22) Filed: Dec. 1, 2015

(65) Prior Publication Data
US 2016/0372557 A1 Dec. 22, 2016

(30) Foreign Application Priority Data
Jun. 18, 2015 (TW) .............................. 104119679 A

(51) Int. Cl.
| H01L 29/778 | (2006.01) |
| H01L 29/78 | (2006.01) |
| H01L 29/40 | (2006.01) |
| H01L 29/06 | (2006.01) |
| H01L 29/10 | (2006.01) |
| H01L 29/20 | (2006.01) |

(52) U.S. Cl.
CPC .......... *H01L 29/78* (2013.01); *H01L 29/0619* (2013.01); *H01L 29/404* (2013.01); *H01L 29/7786* (2013.01); *H01L 29/1066* (2013.01); *H01L 29/2003* (2013.01)

(58) Field of Classification Search
CPC ........... H01L 29/66462; H01L 29/7786; H01L 29/7787; H01L 29/778; H01L 29/7781; H01L 29/7782; H01L 29/7783; H01L 29/7784; H01L 29/7785; H01L 29/7788; H01L 29/7789
See application file for complete search history.

(56) References Cited

U.S. PATENT DOCUMENTS 7,573,078 B2  8/2009  Wu et al.
7,800,131 B2  9/2010  Miyamoto et al.
(Continued)

FOREIGN PATENT DOCUMENTS

| CN | 101238560 | 8/2008 |
| CN | 103780061 | 5/2014 |
| TW | 201322446 | 6/2013 |

*Primary Examiner* — Marcos D Pizarro
*Assistant Examiner* — Shannon Yi
(74) *Attorney, Agent, or Firm* — Hauptman Ham, LLP

(57) ABSTRACT

A semiconductor device includes a substrate, an active layer, a source electrode, a drain electrode, a gate electrode, a first metal layer, and a second metal layer. The active layer is disposed on the substrate. The source electrode and the drain electrode are electrically connected to the active layer. The gate electrode is disposed on the active layer and between the source electrode and the drain electrode. The gate electrode has a first extending portion extending toward the drain electrode. The first metal layer is partially disposed between the first extending portion and the active layer, and extends toward the drain electrode. The second metal layer is disposed above the first extending portion and extends toward the drain electrode. Another portions of the first and second metal layers protrude from the first extending portion. The first metal layer and the second metal layer are electrically connected to the source electrode.

20 Claims, 4 Drawing Sheets

(56) References Cited

U.S. PATENT DOCUMENTS

| | | |
|---|---|---|
| 2006/0138454 A1 | 6/2006 | Saito et al. |
| 2007/0114569 A1 | 5/2007 | Wu et al. |
| 2008/0073670 A1 | 3/2008 | Yang et al. |
| 2008/0128752 A1 | 6/2008 | Wu |
| 2009/0108299 A1 | 4/2009 | Smorchkova et al. |
| 2011/0147798 A1* | 6/2011 | Radosavljevic .... H01L 21/2256 257/194 |
| 2012/0018735 A1* | 1/2012 | Ishii ............ H01L 29/404 257/76 |
| 2012/0049243 A1 | 3/2012 | Wu |
| 2014/0159050 A1* | 6/2014 | Yoon ............ H01L 29/404 257/76 |
| 2014/0239309 A1* | 8/2014 | Ramdani ........ H01L 29/66462 257/76 |
| 2015/0221757 A1* | 8/2015 | Nakayama ...... H01L 27/0605 257/20 |
| 2016/0079066 A1* | 3/2016 | Takada .......... H01L 21/283 257/409 |
| 2016/0079407 A1* | 3/2016 | Aoyama ........ H01L 29/4966 257/76 |
| 2016/0351684 A1* | 12/2016 | Chiu ............ H01L 23/291 |

* cited by examiner

LOW MILLER FACTOR SEMICONDUCTOR DEVICE

RELATED APPLICATIONS

This application claims priority to Taiwan Application Serial Number 104119679, filed Jun. 18, 2015, which is herein incorporated by reference.

BACKGROUND

Field of Invention

The present invention relates to a semiconductor device.

Description of Related Art

As a form of a field effect transistor (FET), a high electron mobility transistor (HEMT) is widely used because of its high electron mobility and low resistance. A key element of the HEMT is a heterojunction formed by two materials with different band gaps, instead of a pn-junction used in the conventional FET. A commonly used material combination of the heterojunction is AlGaN and GaN. Since the heterojunction created by AlGaN and GaN forms a quantum well in the conduction band on the GaN side, a two-dimensional electron gas (2DEG) appears at the interface of AlGaN and GaN.

SUMMARY

An aspect of the present invention is to provide a semiconductor device including a substrate, an active layer, a source electrode, a drain electrode, a gate electrode, a first metal layer, and a second metal layer. The active layer is disposed on the substrate. The source electrode and the drain electrode are respectively and electrically connected to the active layer. The gate electrode is disposed on the active layer and between the source electrode and the drain electrode. The gate electrode has a first extending portion extending toward the drain electrode. The first metal layer is partially disposed between the first extending portion of the gate electrode and the active layer, and extends toward the drain electrode, such that another portion of the first metal layer protrudes from the first extending portion. The first metal layer is electrically connected to the source electrode. The second metal layer is disposed above the first extending portion of the gate electrode and extends toward the drain electrode, such that another portion of the second metal layer protrudes from the first extending portion. The second metal layer is electrically connected to the source electrode.

In one or more embodiments, a horizontal distance between the first metal layer and the drain electrode is nearer than a horizontal distance between the first extending portion and the drain electrode.

In one or more embodiments, a horizontal distance between the second metal layer and the drain electrode is nearer than a horizontal distance between the first extending portion and the drain electrode.

In one or more embodiments, the second metal layer further extends above the source electrode.

In one or more embodiments, the semiconductor device further includes a via disposed between the second metal layer and the source electrode, and connecting the second metal layer and the source electrode.

In one or more embodiments, the semiconductor device further includes a connecting element disposed between the gate electrode and the drain electrode, and connecting the first metal layer and the second metal layer.

In one or more embodiments, a side of the second metal layer facing the source electrode is disposed above the gate electrode.

In one or more embodiments, the semiconductor device further includes a third metal layer disposed between the first metal layer and the second metal layer, and between the first extending portion of the gate electrode and the drain electrode, wherein the third metal layer is electrically connected to the source electrode.

In one or more embodiments, the semiconductor device further includes a first dielectric layer and a second dielectric layer. The first dielectric layer is disposed between the first extending portion of the gate electrode and the first metal layer. The second dielectric layer is disposed between the first extending portion of the gate electrode and the second metal layer, and the third metal layer is disposed between the first dielectric layer and the second dielectric layer.

In one or more embodiments, the semiconductor device further includes a connecting element disposed between the gate electrode and the drain electrode, and connects the first metal layer and the second metal layer.

In one or more embodiments, the gate electrode further has a second extending portion extending toward the source electrode.

In one or more embodiments, the semiconductor device further includes a p-type doped layer disposed between the gate electrode and the active layer.

DETAILED DESCRIPTION

Figure 1:
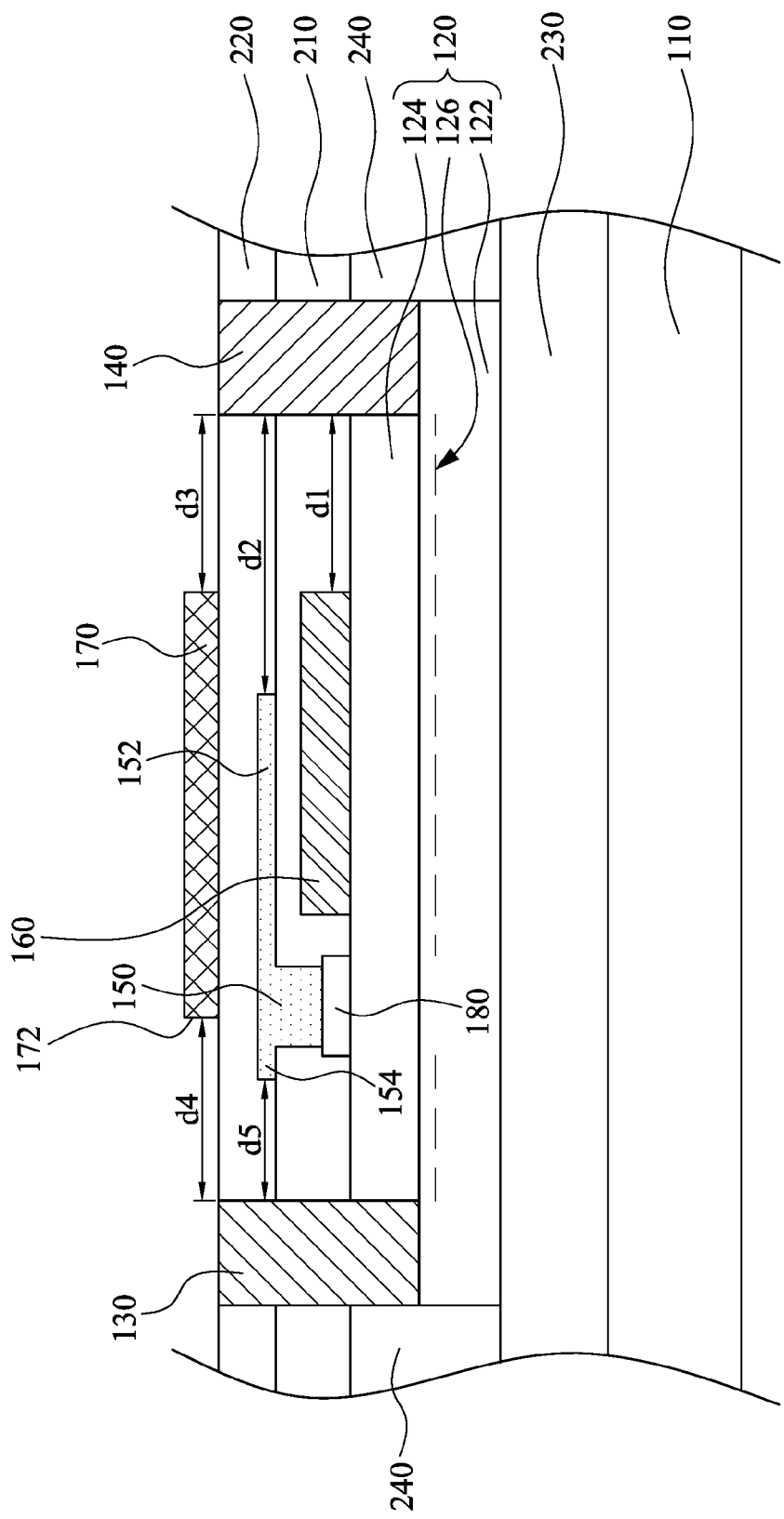
FIG. 1 is a cross-sectional view of a semiconductor device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a semiconductor device according to one embodiment of the present invention. The semiconductor device includes a substrate 110, an active layer 120, a source electrode 130, a drain electrode 140, a gate electrode 150, a first metal layer 160, and a second metal layer 170. The active layer 120 is disposed on the substrate 110. The source electrode 130 and the drain electrode 140 are respectively and electrically connected to the active layer 120. For example, in FIG. 1, at least portions of the source electrode 130 and the drain electrode 140 are disposed in the active layer 120. The gate electrode 150 is disposed on the active layer 120 and between the source electrode 130 and the drain electrode 140. The gate electrode 150 has a first extending portion 152 extending toward the drain electrode 140. The first metal layer 160 is partially disposed between the first extending portion 152 of the gate electrode 150 and the active layer 120, and extends toward the drain electrode 140, such that another portion of the first metal layer 160 protrudes from the first extending portion 152. The first metal layer 160 is electrically connected to the source electrode 130. The second metal layer 170 is disposed above the first extending portion 152 of the gate electrode 150 and extends toward the drain electrode 140, such that another portion of the second metal layer 170 protrudes from the first extending portion 152. The second metal layer 170 is electrically connected to the source electrode 130. In some embodiments, the first metal layer 160 and the second metal layer 170 can be electrically connected to the source electrode 130 through vias or external circuits (not shown), such as wires, and the claimed scope of the present invention is not limited in this respect.

Briefly speaking, the semiconductor device of the present invention reduces the Miller factor of the semiconductor device through increasing the capacitance between the gate electrode 150 and the source electrode 130. Specifically, in this embodiment, a portion of the first metal layer 160 is disposed between the first extending portion 152 and the active layer 120, i.e., the first metal layer 160 overlaps the first extending portion 152. Since the first metal layer 160 is electrically connected to the source electrode 130, and the first extending portion 152 is a part of the gate electrode 150, a gate-source capacitance (Cgs) is formed between the overlapping portion of the first metal layer 160 and the first extending portion 152. Moreover, a portion of the second metal layer 170 is disposed above the first extending portion 152, i.e., the second metal layer 170 overlaps the first extending portion 152. Furthermore, the second metal layer 170 is electrically connected to the source electrode 130, such that another Cgs is formed between the overlapping portion of the second metal layer 170 and the first extending portion 152. With such configuration, the Cgs of the semiconductor device is increased, and the Miller ratio, which is inversely proportional to Cgs, is decreased accordingly. The operation performance of the semiconductor device is improved when the Miller ratio is decreased.

In this embodiment, both the first metal layer 160 and the second metal layer 170 protrude from the first extending portion 152 of the gate electrode 150. In other words, a horizontal distance d1 between the first metal layer 160 and the drain electrode 140 is nearer than a horizontal distance d2 between the first extending portion 152 and the drain electrode 140, and a horizontal distance d3 between the second metal layer 170 and the drain electrode 140 is nearer than the horizontal distance d2 between the first extending portion 152 and the drain electrode 140. With such configuration, the first metal layer 160 and the second metal layer 170 can be electrically barriers between the gate electrode 150 and the drain electrode 140 to reduce the electrically interferences between the gate electrode 150 and the drain electrode 140.

In this embodiment, the gate electrode 150 further has a second extending portion 154 extending toward the source electrode 130. Hence, a distance between the gate electrode 150 and the source electrode 130 gets closer, and the Cgs is further increased, such that the Miller ratio of the semiconductor device can be further decreased.

In this embodiment, a side 172 of the second metal layer 170 facing the source electrode 130 is disposed above the gate electrode 150. In other words, a horizontal distance d4 between the second metal layer 170 and the source electrode 130 is farer than a horizontal distance d5 between the second extending portion 154 and the source electrode 130. Hence, the gate electrode 150 separates the second metal layer 170 and the active layer 120, avoiding a parasitic capacitance formed between the second metal layer 170 and the active layer 120, and also preventing the second metal layer 170 from disturbing the electric field distribution around the active layer 120. However, in some other embodiments, the horizontal distance d4 can be greater than or equal to the horizontal distance d5, and the claimed scope of the present invention is not limited in this respect.

In this embodiment, the semiconductor device further includes a first dielectric layer 210 and a second dielectric layer 220. The first dielectric layer 210 is disposed on the active layer 120 and covers the first metal layer 160. A portion of the first dielectric layer 210 is disposed between the first extending portion 152 of the gate electrode 150 and the first metal layer 160. Moreover, the second dielectric layer 220 is disposed on the first dielectric layer 210 and covers the gate electrode 150. A portion of the second dielectric layer 220 is disposed between the first extending portion 152 of the gate electrode 150 and the second metal layer 170 and the second extending portion 154.

In one or more embodiments, the active layer 120 includes a plurality of nitride-based semiconductor layers to form two-dimensional electron gases (2DEG) 126, which is configured to a conductive channel, at the heterojuction thereof. For example, a gallium nitride (GaN) layer 122 and an aluminum gallium nitride (AlGaN) layer 124 stacked together can be used, and the AlGaN layer 124 is disposed on the GaN layer 122. With such configuration, the 2DEG 126 can exist at the interface of the GaN layer 122 and the AlGaN layer 124. Therefore, when the semiconductor device is at the on-state, the current between the source electrode 130 and the drain electrode 140 can flow along the interface of the GaN layer 122 and the AlGaN layer 124. Furthermore, the substrate 110 can be a silicon substrate or a sapphire substrate, and the claimed scope of the present invention is not limited in this respect. In the present embodiment, the semiconductor device can further include a buffer layer 230 disposed between the active layer 120 and the substrate 110. Moreover, the semiconductor device can further include an isolation area 240 surrounding the peripheral of the active layer 120. The isolation area 240 can avoid leakage current and increase breaking-down voltage.

In this embodiment, the semiconductor device further includes a p-type doping layer 180 disposed between the gate electrode 150 and the active layer 120. The p-type doping layer 180 can suppress the 2DEG 126 of the active layer 120 below the gate electrode 150, such that the 2DEG 126 below the p-type doping layer 180 is interrupted. This performance still exists even without an applied voltage. Therefore, the semiconductor device of the present embodiment is a normally-off (enhancement mode) device.

Figure 2:
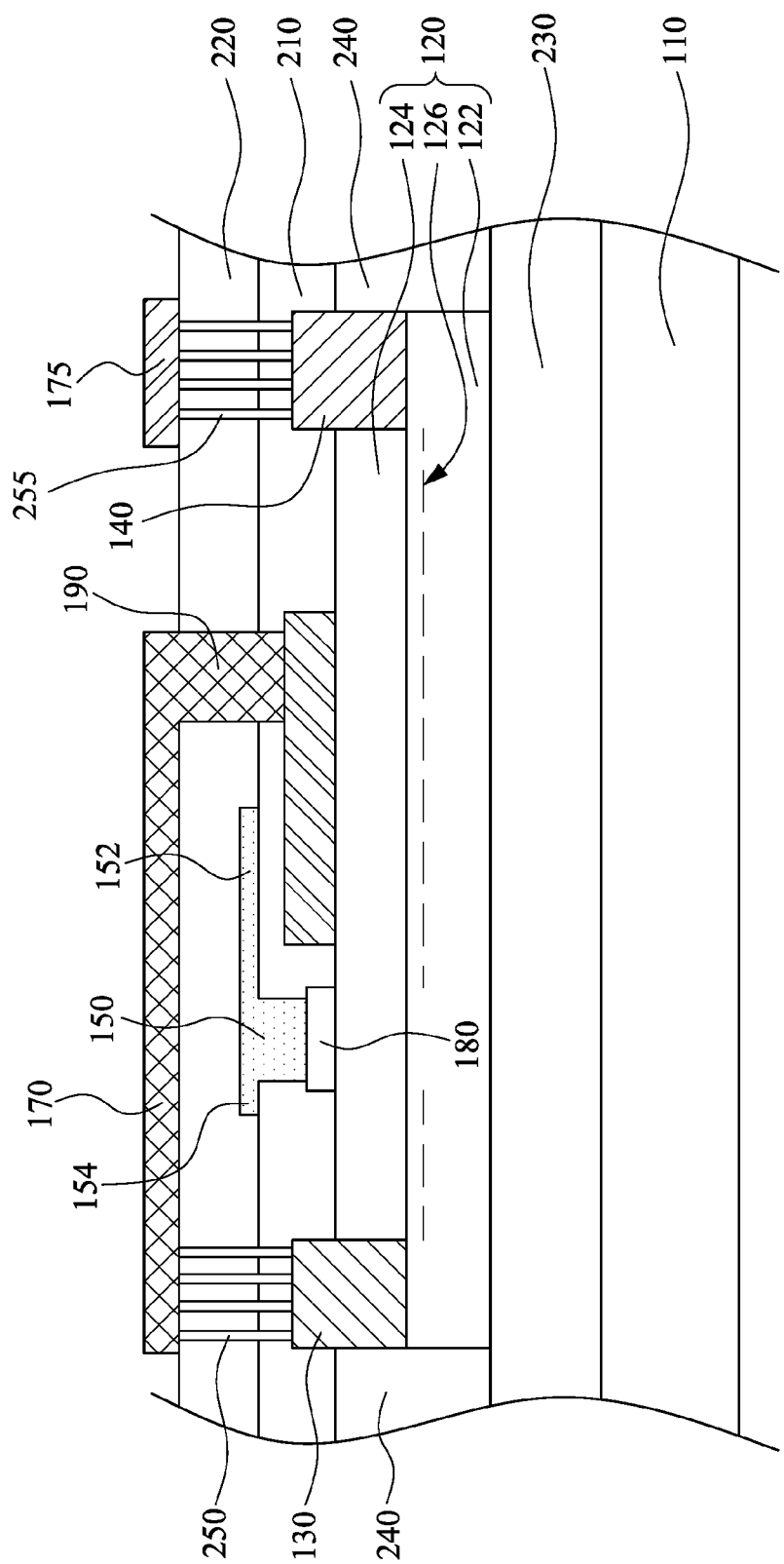
FIG. 2 is a cross-sectional view of a semiconductor device according to another embodiment of the present invention.

FIG. 2 is a cross-sectional view of a semiconductor device according to another embodiment of the present invention. The difference between the present embodiment and the embodiment of FIG. 1 is the configuration of the second metal layer 170. In this embodiment, the second metal layer 170 further extends to above the source electrode 130. Moreover, the semiconductor device further includes vias 250 disposed between and interconnecting the second metal layer 170 and the source electrode 130, such that the second metal layer 170 can be electrically connected to the source electrode 130.

More specifically, in this embodiment, the source electrode 130 can be an ohmic electrode. The source electrode 130 can be connected to the second metal layer 170, which has better electrically conductance than the source electrode 130, to reduce the resistance thereof. Therefore, the second metal layer 170 can improve the resistance of the source electrode 130, and external circuits can be connected to the second metal layer 170.

Moreover, the semiconductor device can further include a connecting element 190 disposed between the gate electrode 150 and the drain electrode 140 and interconnecting the first metal layer 160 and the second metal layer 170. The first metal layer 160 can be connected to the source electrode 130 through the connecting element 190, the second metal layer 170, and the via 250. Therefore, the first metal layer 160, the connecting element 190, and the second metal layer 170 can together surround the space between the gate electrode 150 and the drain electrode 140 to increase Cgs.

Furthermore, the semiconductor device can further include another metal layer 175 and a via 255. The metal layer 175 is disposed on the second dielectric layer 220 and above the drain electrode 140. The via 255 is disposed between the metal layer 175 and the drain electrode 140 to interconnect the metal layer 175 and the drain electrode 140. In this embodiment, the drain electrode 140 can also be an ohmic electrode. The drain electrode 140 can be connected to the metal layer 175, which has better electrically conductance than the drain electrode 140, to reduce the resistance thereof. Therefore, the metal layer 175 can improve the resistance of the drain electrode 140, and external circuits can be connected to the metal layer 175. Moreover, in some embodiments, the second extending portion 154 of the gate electrode 150 can be omitted, and the claimed scope of the present invention is not limited in this respect. Other relevant details of the present embodiment are similar to the embodiment of FIG. 1, and, therefore, a description in this regard will not be repeated hereinafter.

Figure 3:
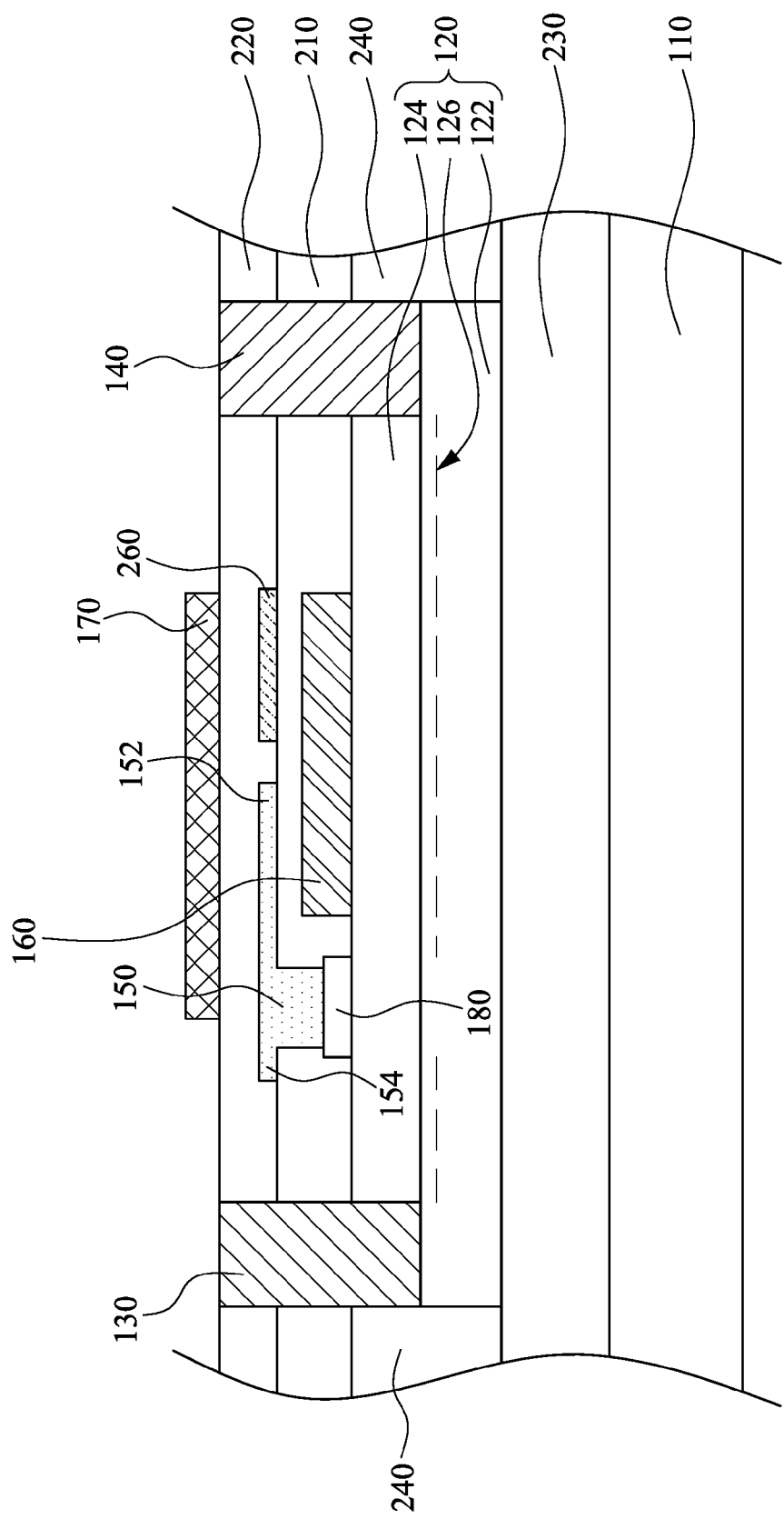
FIG. 3 is a cross-sectional view of a semiconductor device according to yet another embodiment of the present invention.

FIG. 3 is a cross-sectional view of a semiconductor device according to yet another embodiment of the present invention. The difference between the present embodiment and the embodiment of FIG. 1 is the presence of a third metal layer 260. In this embodiment, the third metal layer 260 is disposed between the first metal layer 160 and the second metal layer 170 and between the first extending portion 152 of the gate electrode 150 and the drain electrode 140. The third metal layer 260 is electrically connected to the source electrode 130. For example, in some embodiments, the first metal layer 160, the second metal layer 170, and the third metal layer 260 can be connected to the source electrode 130 through, but not limited to, external circuits.

More specifically, in this embodiment, a portion of the first dielectric layer 210 is disposed between the first extending portion 152 of the gate electrode 150 and the first metal layer 160. The second dielectric layer 220 is disposed between the first extending portion 152 of the gate electrode 150 and the second metal layer 170, and the third metal layer 260 and the first extending portion 152 are together disposed between the first dielectric layer 210 and the second dielectric layer 220. In other words, the gate electrode 150 can be formed with the third metal layer 260 using the same material and/or the same manufacturing process, and the claimed scope is not limited in this respect.

With such configuration, the first metal layer 160, the second metal layer 170, and the third metal layer 260 together surround the space between the gate electrode 150 and the drain electrode 140 to increase Cgs. Moreover, in some embodiments, the second extending portion 154 of the gate electrode 150 can be omitted, and the claimed scope is not limited in this respect. Other relevant details of the present embodiment are similar to the embodiment of FIG. 1, and, therefore, a description in this regard will not be repeated hereinafter.

Figure 4:
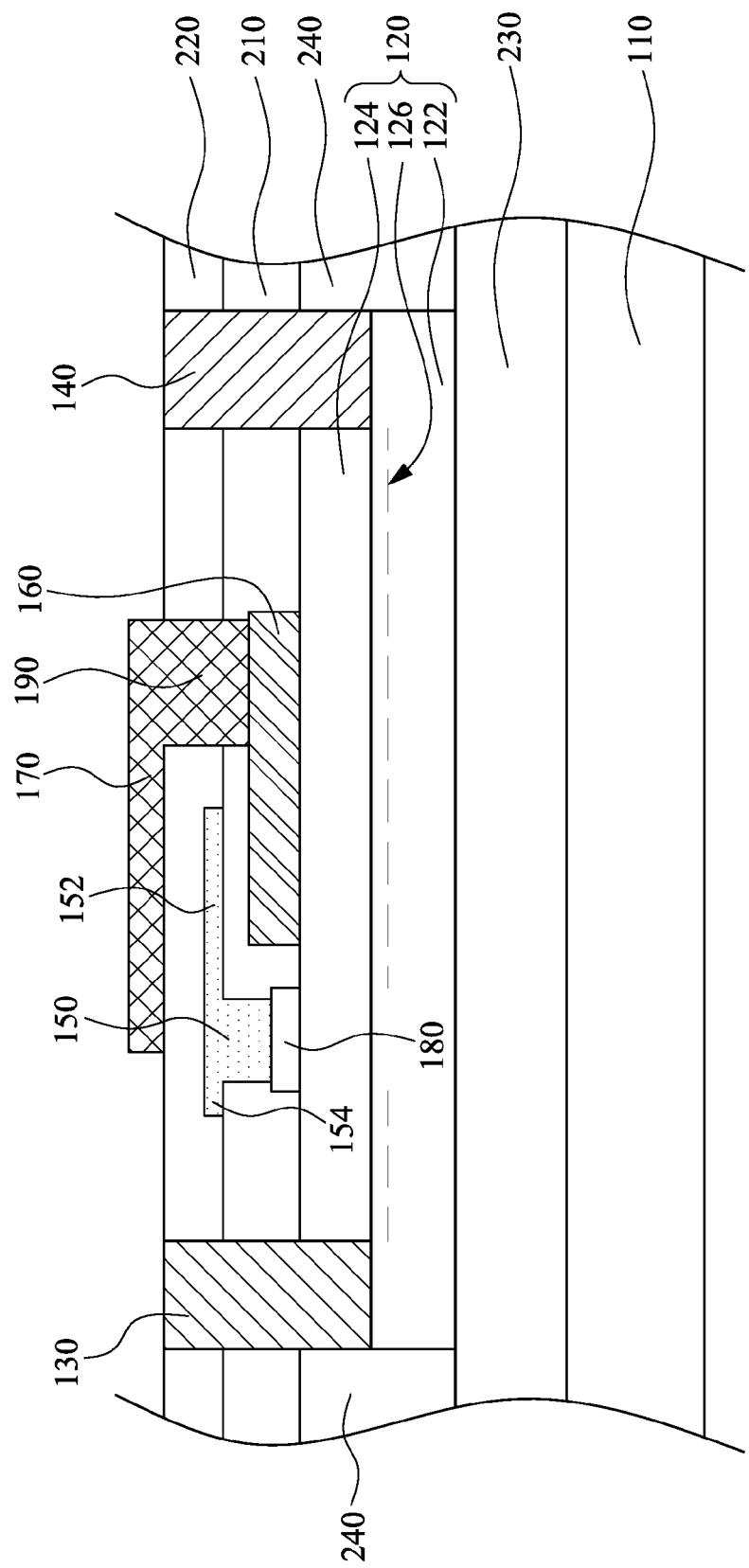
FIG. 4 is a cross-sectional view of a semiconductor device according to still another embodiment of the present invention.

FIG. 4 is a cross-sectional view of a semiconductor device according to still another embodiment of the present invention. The difference between the present embodiment and the embodiment of FIG. 1 is the presence of a connecting element 190. In this embodiment, the connecting element 190 is disposed between the gate electrode 150 and the drain electrode 140, and interconnects the first metal layer 160 and the second metal layer 170. The connecting element 190 can isolate the gate electrode 150 and the drain electrode 140 to reduce electrically interferences between the gate electrode 150 and the drain electrode 140. Moreover, the first metal layer 160, the connecting element 190, and the second metal layer 170 together surround the space between the gate electrode 150 and the drain electrode 140 to increase Cgs.

In some embodiments, the first metal layer 160 and/or the second metal layer 170 can be connected to the source electrode 130 through vias or external circuits (not shown), such as wires, and the claimed scope is not limited in this respect. In some embodiments, the second extending portion 154 of the gate electrode 150 can be omitted, and the claimed scope is not limited in this respect. Other relevant details of the present embodiment are similar to the embodiment of FIG. 1, and, therefore, a description in this regard will not be repeated hereinafter.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims.

What is claimed is:

1. A semiconductor device, comprising:
   a substrate;
   an active layer disposed on the substrate;
   a source electrode and a drain electrode respectively and electrically connected to the active layer;
   a gate electrode disposed on the active layer and between the source electrode and the drain electrode, wherein the gate electrode has a first extending portion extending toward the drain electrode;
   a first metal layer partially disposed between the first extending portion of the gate electrode and the active layer, and extending toward the drain electrode, such that another portion of the first metal layer protrudes from the first extending portion, wherein the first metal layer is electrically connected to the source electrode; and
   a second metal layer disposed above the first extending portion of the gate electrode and extending toward the drain electrode, such that another portion of the second metal layer protrudes from the first extending portion, wherein the second metal layer is electrically connected to the source electrode,
   wherein a horizontal distance between the second metal layer and the drain electrode is longer than or substantially equal to a horizontal distance between the first metal layer and the drain electrode.

2. The semiconductor device of claim 1, wherein the horizontal distance between the first metal layer and the drain electrode is nearer than a horizontal distance between the first extending portion and the drain electrode.

3. The semiconductor device of claim 1, wherein the horizontal distance between the second metal layer and the drain electrode is nearer than a horizontal distance between the first extending portion and the drain electrode.

4. The semiconductor device of claim 1, wherein the second metal layer further extends above the source electrode.

5. The semiconductor device of claim 1, wherein a side of the second metal layer facing the source electrode is disposed above the gate electrode.

6. The semiconductor device of claim 1, wherein the gate electrode has a second extending portion extending toward the source electrode.

7. The semiconductor device of claim 1, further comprising:
a p-type doped layer disposed between the gate electrode and the active layer.

8. The semiconductor device of claim 4, further comprising:
a via disposed between the second metal layer and the source electrode, and connecting the second metal layer and the source electrode.

9. The semiconductor device of claim 5, further comprising:
a third metal layer disposed between the first metal layer and the second metal layer, and between the first extending portion of the gate electrode and the drain electrode, wherein the third metal layer is electrically connected to the source electrode.

10. The semiconductor device of claim 5, further comprising:
a connecting element disposed between the gate electrode and the drain electrode, and connecting the first metal layer and the second metal layer.

11. The semiconductor device of claim 8, further comprising:
a connecting element disposed between the gate electrode and the drain electrode, and connecting the first metal layer and the second metal layer.

12. The semiconductor device of claim 9, further comprising:
a first dielectric layer disposed between the first extending portion of the gate electrode and the first metal layer; and
a second dielectric layer disposed between the first extending portion of the gate electrode and the second metal layer, and the third metal layer disposed between the first dielectric layer and the second dielectric layer.

13. A semiconductor device, comprising:
a substrate;
an active layer disposed on the substrate;
a source electrode and a drain electrode respectively and electrically connected to the active layer;
a gate electrode disposed on the active layer and between the source electrode and the drain electrode, wherein the gate electrode has a first extending portion extending toward the drain electrode;
a first metal layer partially disposed between the first extending portion of the gate electrode and the active layer, and extending toward the drain electrode, such that another portion of the first metal layer protrudes from the first extending portion, wherein the first metal layer is electrically connected to the source electrode;
a second metal layer disposed above the first extending portion of the gate electrode and extending toward the drain electrode, such that another portion of the second metal layer protrudes from the first extending portion, wherein the second metal layer is electrically connected to the source electrode, wherein a horizontal distance between the second metal layer and the drain electrode is longer than or substantially equal to a horizontal distance between the first metal layer and the drain electrode; and
a p-type doped layer disposed between the gate electrode and the active layer, wherein the first metal layer and the source electrode are respectively disposed on opposite sides of the p-type doped layer.

14. The semiconductor device of claim 13, wherein the horizontal distance between the first metal layer and the drain electrode is nearer than a horizontal distance between the first extending portion and the drain electrode.

15. The semiconductor device of claim 13, wherein the horizontal distance between the second metal layer and the drain electrode is nearer than a horizontal distance between the first extending portion and the drain electrode.

16. The semiconductor device of claim 13, wherein the second metal layer further extends above the source electrode.

17. The semiconductor device of claim 13, wherein a side of the second metal layer facing the source electrode is disposed above the gate electrode.

18. The semiconductor device of claim 16, further comprising:
a via disposed between the second metal layer and the source electrode, and connecting the second metal layer and the source electrode.

19. The semiconductor device of claim 17, further comprising:
a third metal layer disposed between the first metal layer and the second metal layer, and between the first extending portion of the gate electrode and the drain electrode, wherein the third metal layer is electrically connected to the source electrode.

20. The semiconductor device of claim 18, further comprising:
a connecting element disposed between the gate electrode and the drain electrode, and connecting the first metal layer and the second metal layer.

* * * * *